United States Patent [19]
McCorkle

[11] Patent Number: 5,764,551
[45] Date of Patent: Jun. 9, 1998

[54] FAST HIGH-SIGNAL-TO-NOISE RATIO EQUIVALENT TIME PROCESSOR

[75] Inventor: John W. McCorkle, Laurel, Md.

[73] Assignee: The United States of America as represented by the Secretary of the Army, Washington, D.C.

[21] Appl. No.: 730,608

[22] Filed: Oct. 15, 1996

[51] Int. Cl.$^6$ .................................................. G06F 17/10
[52] U.S. Cl. ........................... 364/724.011; 364/487
[58] Field of Search .................... 324/76.15; 327/91, 327/94; 341/122; 364/487, 724.011, 724.1

[56] References Cited

U.S. PATENT DOCUMENTS

| | | | |
|---|---|---|---|
| 4,678,345 | 7/1987 | Agoston | 368/119 |
| 4,755,951 | 7/1988 | Hollister | 364/487 |
| 5,122,800 | 6/1992 | Philip | 341/156 |
| 5,260,670 | 11/1993 | Ainsworth et al. | 327/94 |

*Primary Examiner*—Chuong Dinh Ngo
*Attorney, Agent, or Firm*—Paul S. Clohan; Frank J. Dynda

[57] ABSTRACT

The present invention generally relates to ultra high bandwidth, ultra high sample rate systems and more particularly to equivalent time sampling and signal reconstruction. The disclosed technique provides a means to obtain high SNR (signal to noise ratio), uniformly spaced, ET (equivalent time) measurements from data where each point may have differing SNR and/or where the data is not uniformly spaced. The invention disclosed provides least-square optimum SNR output data from a plurality of arbitrarily time-skewed input data. The invention further discloses an implementation of the technique that requires no matrix inversion, but instead puts nearly all operations in a vector multiply or vector add form. The disclosed technique vectorizes the required equations allowing the invention to be implemented in low cost real-time hardware—that is, DSP (digital signal processing) integrated circuits, common micro-processors, or special purpose chip sets.

6 Claims, 7 Drawing Sheets

FAST HIGH-SIGNAL-TO-NOISE RATIO EQUIVALENT TIME PROCESSOR

TECHNICAL FIELD

The invention disclosed provides a least-square optimum SNR (signal-to-noise ratio) from ET (equivalent time) data. It therefore has broad application in high speed test equipment. It is especially important in applications where signal-power and integration-time is limited. This restriction is often encountered in applications of general purpose test equipment. For example, assembly line testing for quality assurance typically demands high throughput rates. The invention disclosed allows maximum throughput from an ET measurement system. Similarly, radar systems have stringent power and integration time restrictions. Loss of signal-to-noise ratio in a radar system impacts the transmitter size (power), the detection range, and the dwell time required to detect a target. The present invention allows a radar that uses ET processing to maximize its detection range.

BACKGROUND ART

The term "equivalent time processing" is a term applied to a technique that has been used by oscilloscope manufacturers for the past 20 years to obtain ultra high speed, high frequency, high bandwidth measurements. It works only on repetitive signals. It is based on the fact that by definition, for any integer n, when a signal repeats every $\Gamma$ seconds, measurements made $n\Gamma+\epsilon$ apart result in the same values as taking measurements only $\epsilon$ seconds apart. Therefore measurements taken relatively slowly in real time (every $n\Gamma+\epsilon$ seconds) can represent a signal as if it were sampled at a very fast equivalent-time rate (every $\epsilon$ seconds).

Historically, the most popular instrument using the ET technique is known as a "sampling oscilloscope". Such oscilloscopes use a trigger circuit to produce a timing pulse at precisely the same point on the repetitive waveform. At some time $t_i$ after the trigger pulse, a sample of the signal is obtained. If an N point record of the waveform is desired, covering a time interval T, then let i go from 0 to N−1 as N triggers occur, and $t_i = i*T/N$. The output record becomes $s(t_i)$—a vector of samples of the input signal sampled at times $t_i$. In this case, each repetition of the waveform that generates a trigger produces a single point in the output record. In early sampling oscilloscopes, the $t_i$ were actually measured in random order. In later models, efforts lead to sweeping the $t_i$ times to make i increment monotonically as the equation might imply.

More recently, companies such as Tektronix, Hewlett-Packard, Nicholet etc. have brought the technique to their digitizing oscilloscopes with one important difference—for each trigger, they generate a plurality of output points. In this case, an A/D (analog to digital) converter is being clocked at some interval $\tau$. In this case, the old $t_i$ becomes $$t_i = (i_{mod\ R}*\tau/R) + (floor(i/R)*\tau) \quad (1)$$

allowing a repetitive signal to be sampled in equivalent-time increments that are R times smaller than the A/D clock interval. The first term in equation (1) ($i_{mod\ R}*\tau/R$) is the skew-time ($T_s$)—the time between the trigger and the first sample in a particular input record. The second term is due to the raw A/D being clocked at interval $\tau$. Using this scheme, a record length of N=MR points covering an interval $T=M\tau$ can be obtained by:

1) using the A/D converter to record R input data records where each record contains M points of the waveform with sample spacing of $\tau$; wherein, 2) the skew-time on each of the R input data records is adjusted such that the samples in any of the R input data records are at $t_i$ where $i=j+kR$ and $k=0,1,2,\ldots,M-1$ and where j is different for each of the R records (e.g. j=0 to R−1), and where $t_{i+1}-t_i=\tau/R$; and 3) interleaving the R records to assemble the N=MR point output record that is an equivalent-time recording of the signal, $s(t_i)$.

Figures 1A, 1B:
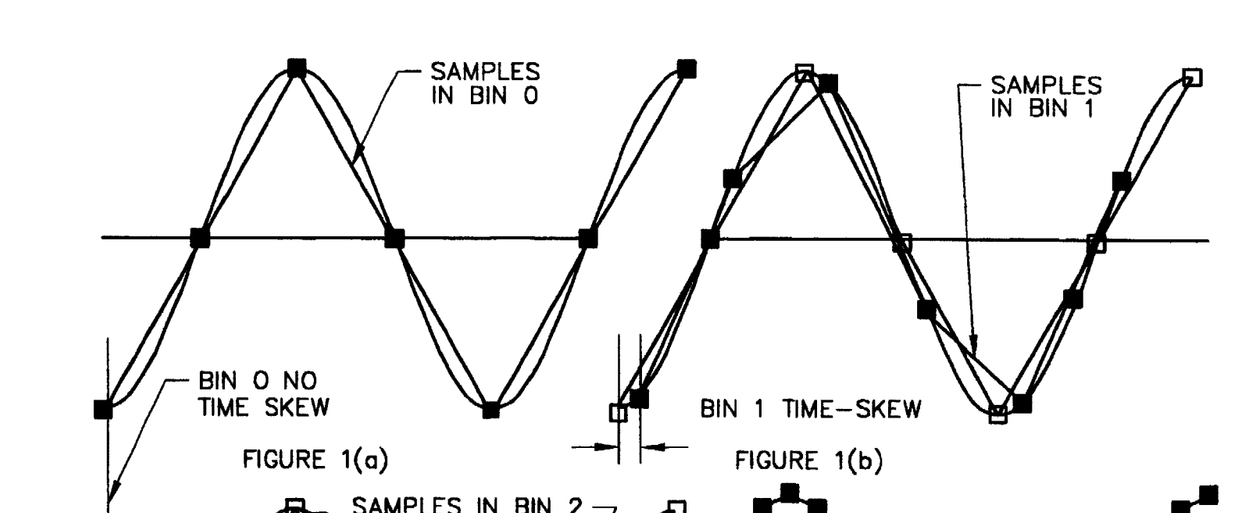
FIG. 1 illustrates the interleaving of multiple skewed input data records to obtain an output data record with higher sample rate and with frequency components above the Nyquist limit of the input data records.
Figures 1C, 1D:
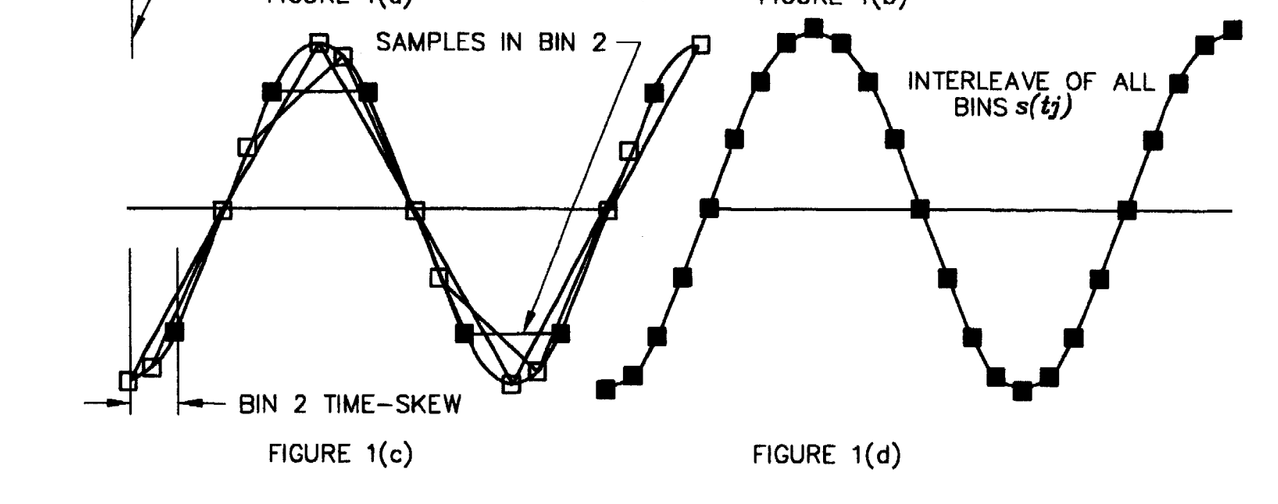

FIG. 1 (a)–(d) illustrate this ET data collection sequence with multiple records interleaved. FIG. 1 (a) shows a sine wave to be sampled, and in bold, the samples taken on the first trigger with $i=0, R, 2R, 3R, \ldots, (M-1)R$; (b) shows the same wave with points from trigger $i=1, R+1, 2R+1, 3R+1, \ldots, (M-1)R+1$ added in bold; (c) shows the same wave with points from trigger $i=2, R+2, 2R+2, 3R+2, \ldots, (M-1)R+2$ added in bold; and (d) shows the completed sampled waveform, comprised of R(R=4) interleaved records. This waveform appears to be digitized at a high sample rate of $\tau/R$, yet is actually an interleave of the low sample rate records obtained after R=4 triggers, where there is a different time skew between the trigger and the signal on each of the R=4 triggers.

One difficulty that arises with this approach is that in many systems, the A/D clock is not and often cannot be synchronized to the repetitive signal. When this synchronization is missing, the skew-time from record to record is random. This randomness causes two problems. The first problem—simply knowing where the samples were—is addressed by a time-skew measuring circuit that tells the instrument the time-skew ($T_s$) between the trigger and the A/D sampling clock. With this information the oscilloscope can produce an x-y plot with time on one axis and the signal samples on the other. However, this form of operation is not typically done because of the second problem—the signal samples need to be evenly spaced in time in order to streamline signal processing and display steps. Even spacing also conserves data storage requirements because the list of $t_i$ need not be stored, but only two values: the constant time increment; and the time to the first sample.

Figure 2:
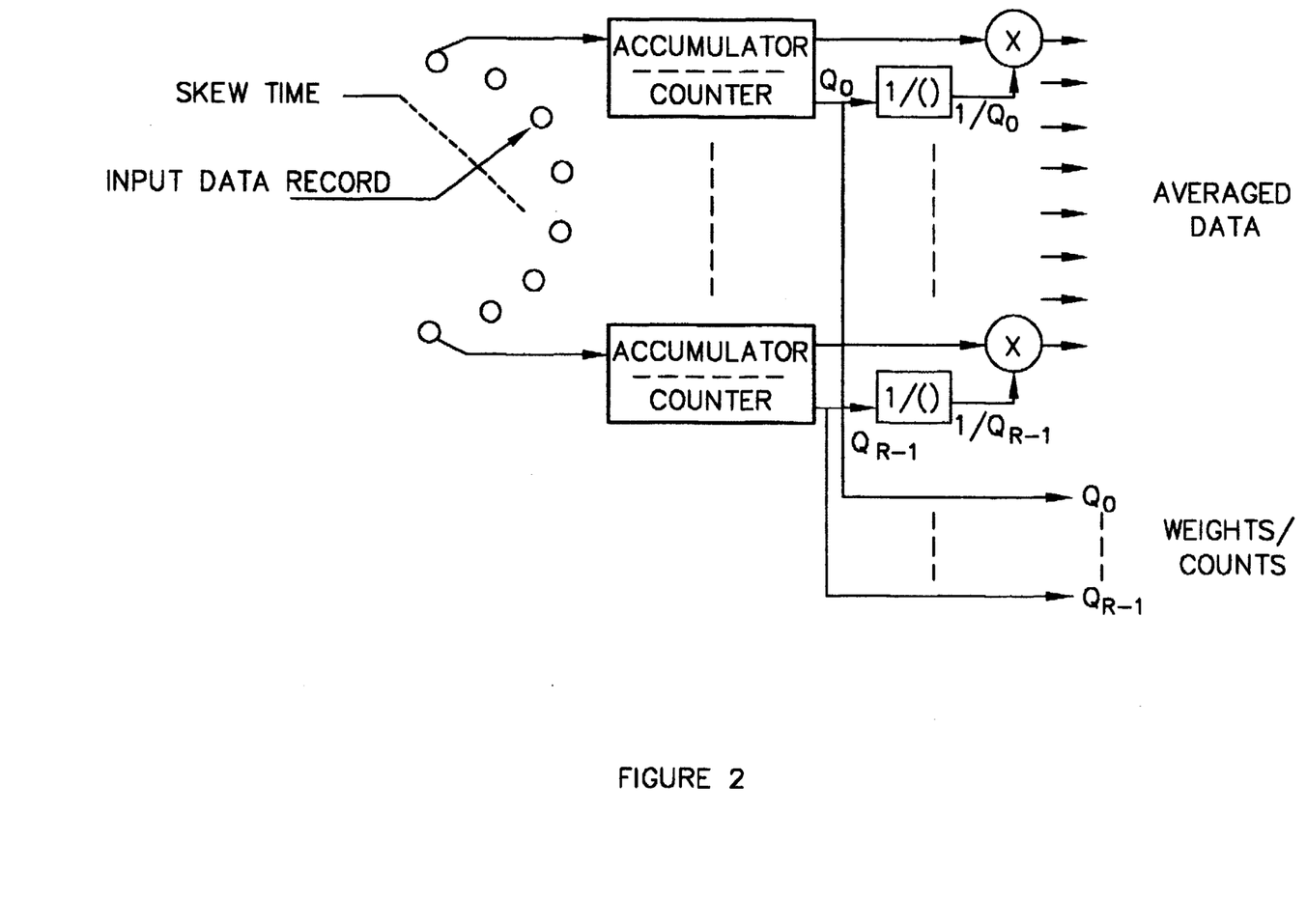
FIG. 2 is a block diagram illustrating sorting the input data by skew-time and averaging.

Typically, to get the samples evenly spaced, records are simply sorted by $T_s$-time, accumulated in bins and averaged, and the results treated as if it were taken at the midpoint time. For example, bin-1 might average all pulses with a $T_s$-time between −50 ps and +50 ps and be treated as $T_s=0$, bin 2 might receive all pulses with a $T_s$-time between 50 and 150 ps. and be treated as $T_s=100$ ps. and so forth. Equation (2) describes the signal contained in Bin-n, after sorting and averaging. FIG. 2 illustrates the operation pictorially. The problem with this formulation is that additional noise is added due to the fact that the true sample times are not used. The wider the bins are in time, the more noise is added.

$$B_{n,k} = \frac{1}{Q_n} \sum_{j=1}^{Q_n} s_{j,n}(k \cdot \tau) \quad (2)$$

where:

$Q_n$ is a count of the records occurring with a $T_s$ placing them in the $n^{th}$ bin;

n=0 ... R−1; the index to a bin containing the average of data with $(n-\frac{1}{2})\xi < T_s \leq (n+\frac{1}{2})\xi$ R=the number of bins used to partition the equivalent-time intervals $\xi = \tau/R$; the time increment between bins.

$\tau$=the A/D clock interval.

k=0 ... M−1; the index to the samples in each record produced by the A/D

M=the number of A/D samples in an input data record (generated after a trigger signal);

$s_{j,n}(k \cdot \tau)$=the digitized signal produced by the $j^{th}$ record falling into the $n^{th}$ bin Interleaving the data is accomplished by (a) storing the $B_{n,k}$ data in memory as a single vector, (b) treating the data as if it were an R-by-M matrix; (c) performing a matrix transpose operation; and (d) reading the data out of the memory as a single vector of data. Equation (3) shows an example of this formulation, where memory is mapped to index across rows, s(t) refers to the signal as depicted in FIG. 1, and R and M are 4.

starts in memory as: $s(0), s(\tau), s(2\tau), \ldots s((M-1)\tau), s(\tau/4), s(\tau/4 + \tau), s(\tau/4 + 2\tau), \ldots$ $$\begin{array}{c} Bin-0 \\ Bin-1 \\ Bin-2 \\ Bin-3 \end{array} \begin{bmatrix} s(0) & s(\tau) & s(2\tau) & \ldots s((M-1)\tau) \\ s(\tau/4) & s(\tau+\tau/4) & s(2\tau+\tau/4) & \ldots s((M-1)\tau+\tau/4) \\ s(\tau/2) & s(\tau+\tau/2) & s(2\tau+\tau/2) & \ldots s((M-1)\tau+\tau/2) \\ s(3\tau/4) & s(\tau+3\tau/4) & s(2\tau+3\tau/4) & \ldots s((M-1)\tau+3\tau/4) \end{bmatrix} = \begin{bmatrix} B_{0,0} & B_{0,1} & B_{0,2} & \ldots B_{0,M-1} \\ B_{1,0} & B_{1,1} & B_{1,2} & \ldots B_{1,M-1} \\ B_{2,0} & B_{2,1} & B_{2,2} & \ldots B_{2,M-1} \\ B_{3,0} & B_{3,1} & B_{3,2} & \ldots B_{3,M-1} \end{bmatrix} \quad (3)$$

$$\text{Transpose} \Rightarrow \begin{bmatrix} s(0) & s(\tau/4) & s(\tau/2) & s(3\tau/4) \\ s(\tau) & s(\tau+\tau/4) & s(\tau+\tau/2) & s(\tau+3\tau/4) \\ s(2\tau) & s(2\tau+\tau/4) & s(2\tau+\tau/2) & s(2\tau+3\tau/4) \\ \cdot & \cdot & \cdot & \cdot \\ \cdot & \cdot & \cdot & \cdot \\ \cdot & \cdot & \cdot & \cdot \\ s((M-1)\tau) & s((M-1)\tau+\tau/4) & s((M-1)\tau+\tau/2) & s((M-1)\tau+3\tau/4) \end{bmatrix}$$

now in memory as $s(0), s(\tau/4), s(\tau/2), s(3\tau/4), s(\tau), s(\tau+\tau/4), \ldots, s((M-1)\tau+3\tau/4)$ Typically, when N signals are averaged, one expects the SNR to improve by $$\sqrt{N}.$$

Figure 3:
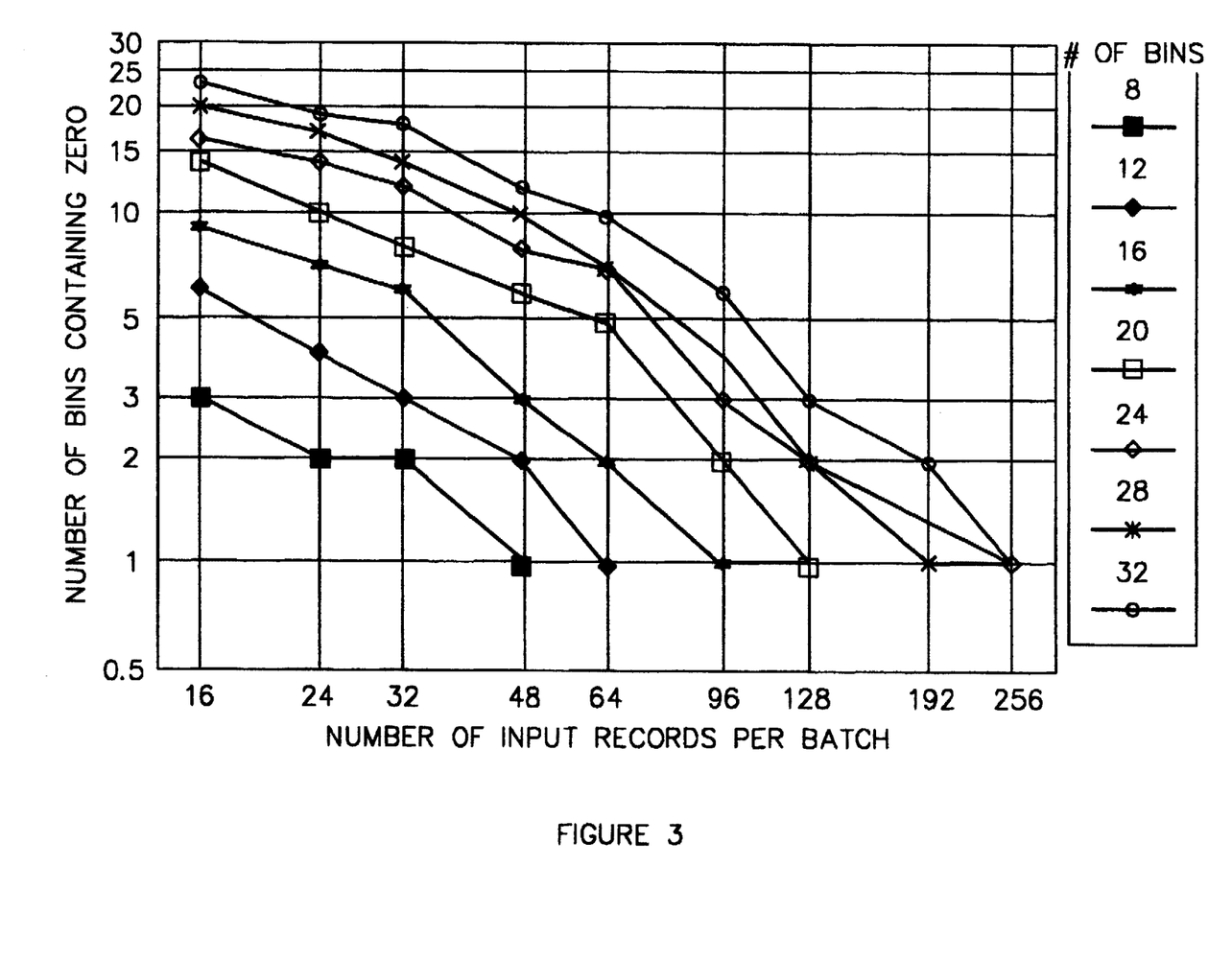
FIGS. 3, 4 and 5 show some statistics regarding bins containing no data, i.e. $Q_n=0$.
Figure 4:
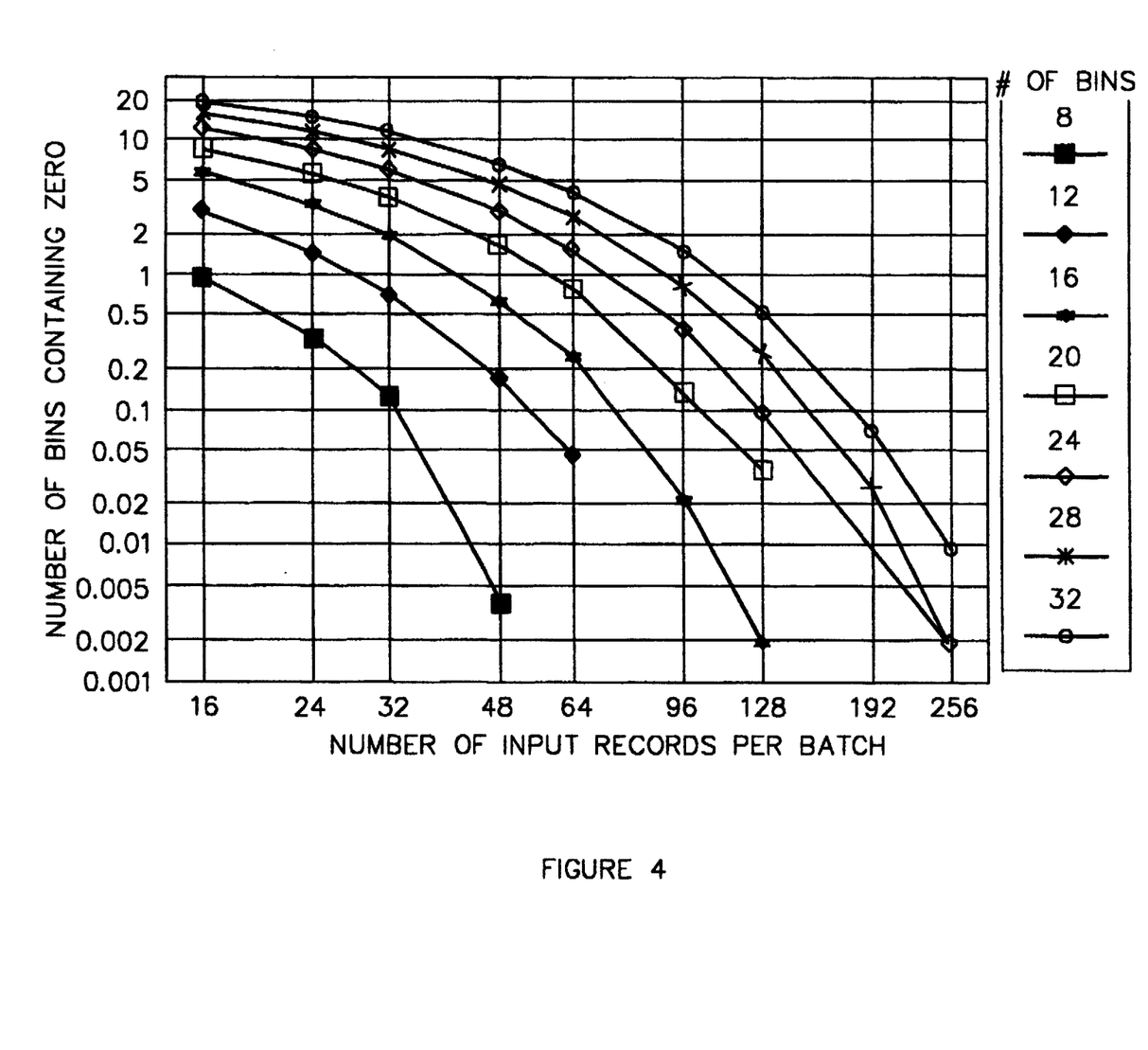
Figure 5:
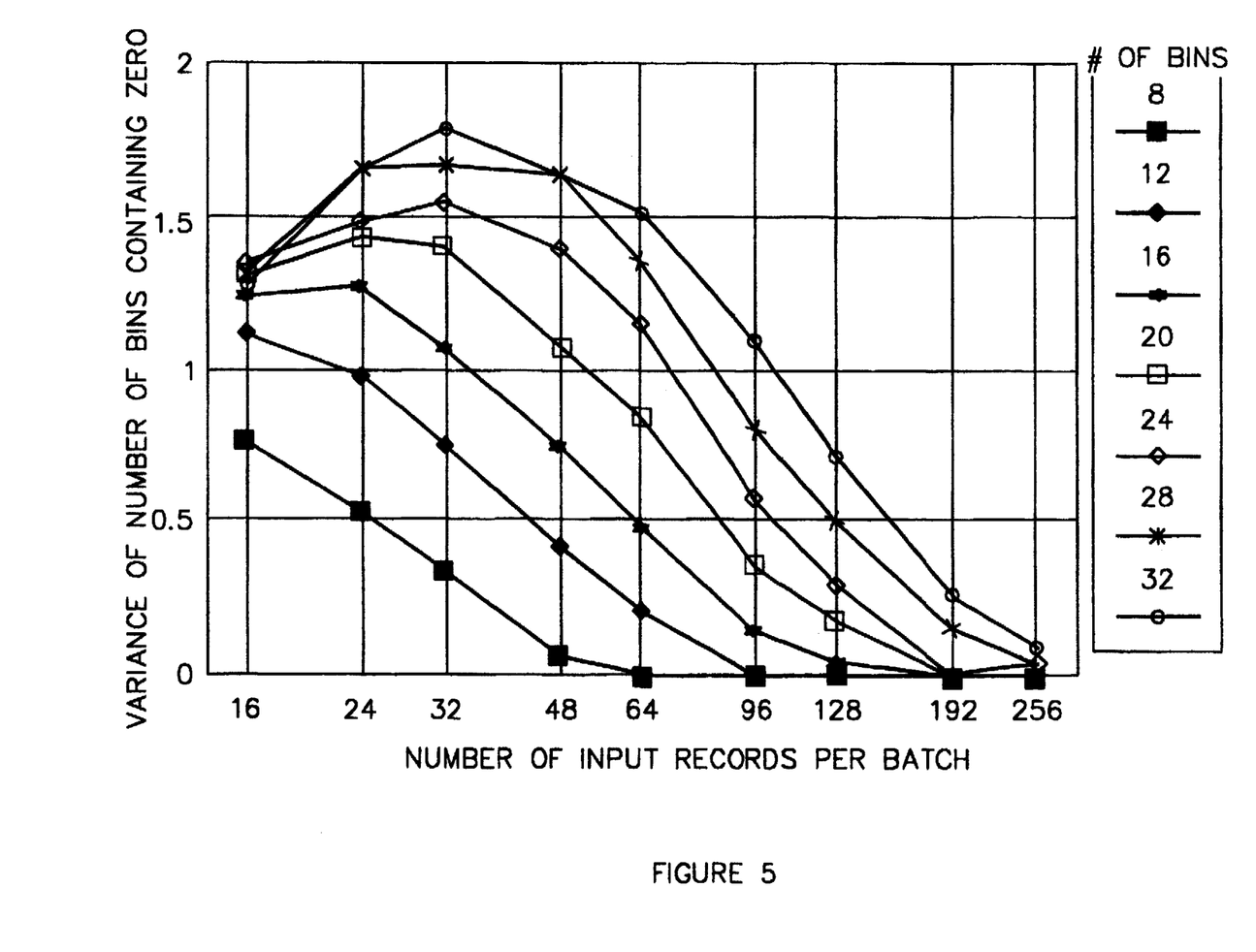

But for this formulation, it does not. Usually $Q_i \neq Q_j$ for $i \neq j$. Therefore some points in the interleaved waveforms are high SNR while others are low SNR. In fact, for some n, $Q_n$ may even be zero! FIGS. 3, 4, and 5 show some statistics regarding bins containing no data, i.e. $Q_n=0$. These demonstrate the significance of the problem. FIG. 3 shows the number of bins with $Q_n=0$ in worst case batch out of 10,000 test cases. FIGS. 4 and 5 show the average number of bins with $Q_n=0$ and the standard deviation respectively.

A simplistic way to smooth an interleaved record is to simply filter it with a low pass filter. However, since all linear filtering techniques treat all points in a waveform equally, the low SNR points will limit the SNR of the filtered records. In fact, for the case where there are bins with $Q_n=0$, even if the input data were noiseless, the output data would be incorrect.

For example, taking the case from FIG. 4 where there are 32 bins, and 64 records in an input batch, the average number of bins with $Q_n=0$ is 5. Therefore, if the input records all contained a signal of 1 volt DC, then the output record would have a DC value of only 27/32 volts (16% low), plus it would have higher frequency terms. Even if one multiplies the output data record by 32/27 (R/(R−R') where R' is the number of bins with $Q_n=0$) to account for this shift at DC, it does not correct the rest of the spectrum correctly. The higher frequency terms are a function of the pattern of zero's in the interleaved data caused by the bins containing no data. Due to these zero SNR bins, the smoothing filter would become more like an interpolation filter and would need to limit the output spectrum to the Nyquist rate of $f_s/2$ ($f_s$=sample rate) of the input data. Nonetheless, the spectrum would still be affected by the pattern of zero SNR bins.

This "random SNR among points" problem is addressed several ways by manufacturers. Some manufacturers build their instruments to simply collect >>NR records until $Q_n \geq N$ for all n—tossing records falling into a bin already containing N records. Clearly this operating scheme tosses signal energy that could be used to increase the SNR. It also wastes time as it waits for a $T_s$ time needed for an partially full bin. Some vendors provide a user selectable "percent fill" value so that if one desires all Q to be 100, for example, the measurement would complete when the smallest Q had some percent less. In both cases, the achievable SNR is not obtained and extra time is wasted collecting the extra records to obtain an acceptable SNR. In any solution, two factors are critical. First, the cost of the instrument must allow successful marketing. Second, the solution must be fast enough to allow the user to collect data at desired rates, and/or to view the data in real time using an interactive interface.

Therefore, there is need in the prior art for a means to obtain high SNR uniformly spaced ET (equivalent time) measurements from nonuniformly spaced data with unequal SNR among points. Moreover, there is further need to obtain frequency spectrum (bandwidth) in output ET data that is greater than the Nyquist bandwidth in the input data. Moreover, there is further need in the prior art for accomplishment of these objectives using vectorized hardware that is both fast and low cost.

DISCLOSURE OF THE INVENTION

The present invention generally relates to ultra high bandwidth, ultra high sample rate systems and more particularly to equivalent time sampling and signal reconstruction. The disclosed technique provides a means to obtain high SNR (signal to noise ratio), uniformly spaced, ET (equivalent time) measurements from data where each point may have differing SNR and/or where the data is not uniformly spaced. The invention disclosed provides a least-square optimum SNR output data from a plurality of arbitrarily time-skewed input data. The invention further discloses an implementation that requires no matrix inversion, but instead puts nearly all operations in a vector multiply or vector add form. The disclosed technique vectorizes the required equations allowing the invention to be implemented in low cost real-time hardware—that is, DSP (digital signal processing) integrated circuits, common micro-processors, or special purpose chip sets.

More particularly, the present invention relates to an equivalent time processor comprising: a first input stage for receiving a set of input data records wherein each input data record has a plurality of equally spaced data points representing a signal plus noise which has been sampled with a sample spacing of $\tau$, and wherein the set of input data records are time-skewed with respect to each other in an arbitrary fashion, relative to the desired signal; a second input stage for receiving a set of skew-time, $T_r$, measurements of the time between a trigger synchronous with the desired signal and the sample-time of the first data point in each of the input data records; an output stage for providing an output record as a high SNR, high bandwidth, uniformly spaced, equivalent time measurement; and a processor that uses the set of skew-time measurements and the set of input data records to generate the output data record having a plurality of equally spaced data points representing the desired signal plus lower noise, which has been sampled with a sample spacing of $m\tau/n$ where m and n are any positive integers, and wherein the processor combines the set of arbitrarily skewed input data records such that the plurality of samples in the output record have a least-squares optimal SNR (signal to noise ratio), and wherein the processor optimally preserves frequency components beyond the Nyquist limit of the input data records by combining the set of arbitrarily skewed input data records such that the plurality of samples in the output record contain frequency components beyond the Nyquist limit of the input data records.

BEST MODE FOOR CARRYING OUT THE INVENTION

The invention will now be described in more detail in terms of its fundamental operation and the vectorizable analytic solution to weighted least squares employed therein.

1. FUNDAMENTAL OPERATION

The basic technique is to produce a separate optimized polynomial approximation to the raw interleaved data, at each output time $t_i$, (where the region of data used to derive each polynomial is a small window of p points centered on the output point) and use the polynomial to compute the output data point. Since the polynomial is based on p points local to the output time $t_i$, the value computed by the polynomial is less sensitive to noise than any single input data point. The polynomial used is a weighted least squares optimal fit to the data, and the weights are based on the SNR of the input data points. As a result, the SNR of the computed output point is optimal for the given data set—even if the original data had, at the output point or any other point, an SNR of zero. A measure of the SNR in any bin is provided by the number of pulses, $Q_n$, averaged together to form that bin—which can, of course, be zero.

As an illustration, equation (4) is a 2nd order, or quadratic polynomial fit to the data where the coefficients (the x's) are optimized over a region of data surrounding the output point $t_i$, such that the polynomial fit ($\hat{s}(t_{i+a})$) is made approximately equal to the original data ($s(t_{i+a})$).

$$s(t_{i+a}) \approx \hat{s}(t_{i+a}) = x_0 + x_1 a + x_2 a^2 \text{ for } -(p-1)/2 \leq a \leq (p-1)/2. \tag{4}$$

The coefficients can be solved for by setting up a matrix equation with the usual $Ax=b$ form. For example, for $p=5$, $a=-2$ to 2, and we get:

$$\begin{bmatrix} 1 & -2 & 4 \\ 1 & -1 & 1 \\ 1 & 0 & 0 \\ 1 & 1 & 1 \\ 1 & 2 & 4 \end{bmatrix} \cdot \begin{bmatrix} x_0 \\ x_1 \\ x_2 \end{bmatrix} = \begin{bmatrix} s(t_{i-2}) \\ s(t_{i-1}) \\ s(t_i) \\ s(t_{i+1}) \\ s(t_{i+2}) \end{bmatrix} \Rightarrow Ax = b. \tag{5}$$

Key here is that matrix A in (5) is specifically set up so that the output point of interest is at $a=0$. This formulation of A makes $\hat{s}(t_i) \equiv x_0$. The advantage is that the solutions to $x_1$ and $x_2$ are not needed. Therefore the solution can be found much faster and with less hardware. Note that p is typically odd (as shown in the examples) so that the window is centered and has a point at the output point. However, this is not necessary. In fact, the a terms can be non integers, and/or uncentered. This fact is useful to handle multi-rate systems.

Since A is not square, it cannot simply be inverted, but a pseudo-inverse provides the standard LS solution. The weighted LS solution is:

$$x = [(A^T W A)^{-1} A^T W] b, \text{ where } W \text{ is the weight matrix} \tag{6}$$

Solving for the first term in x, $(x_0)$, results in an equation like (7), where the c terms are the first row of $(A^T W A)^{-1} A^T W$.

$$x_0 = \hat{s}(t_i) = \sum_{j=-(p-1)/2}^{(p-1)/2} c_j s(t_{i+j}) \Rightarrow \sum_{j=-8}^{8} c_j s(t_{i+j}) \text{ for 17 points} \tag{7}$$

A second key is that the weight matrix W is specific to the bin containing the output point. If the output point $t_i$ is contained in bin n, then $W_n$ is a p-by-p matrix formed with the appropriate Q on the diagonal, and zeros off the diagonal in both the upper and lower triangular regions, as shown in equation (8).

$$W_n = \begin{bmatrix} Q_{n-\frac{(p-1)}{2}} & 0 & 0 & 0 & 0 \\ 0 & \cdot & 0 & 0 & 0 \\ 0 & 0 & Q_n & 0 & 0 \\ 0 & 0 & 0 & \cdot & 0 \\ 0 & 0 & 0 & 0 & Q_{n+\frac{(p-1)}{2}} \end{bmatrix} \tag{8}$$

where:

$Q_n \Rightarrow Q_{n+R}$ for $n<0$ $Q_n \Rightarrow Q_{n-R}$ for $n>R-1$ (or the subscript is modulo R)

n references the input data bin containing the point $t_i$.

Two points should be noted here regarding equation (7). First, note that while the value of the coefficients ($c_j$) are governed by the order of the fit, the equation's form is independent of the order of the fit. Therefore, the fast vectorized technique used to compute them will be shown to be completely general. Second, note that decimation can be take place to such that no computations are wasted on points that would be tossed in the decimation. So, for example, if decimation by a factor of d were desired, one would only compute output points for i=0, d, 2d, 3d, . . . MR/d. This fact is important because it allows the input data to be sorted into extremely finely spaced bins (15.625 ps in the case of the UWB radar) yet produce output data that is closer to the desired Nyquist rate (250 ps in the case of the UWB radar), without excessively burdensome computations.

2. Choosing Fundamental Curve Fitting Parameters

We must establish what curve is reasonable to use to fit to the data. In other words, what degree of polynomial, and how many points (p) should be used. The fit must retain the bandwidth of the measurement as well as obtain the SNR expected from averaging multiple measurements. All equivalent-time measurement systems have inherent limitations usually expressed in the time domain as 10% to 90% rise time, percent overshoot, and settling time to 5%, or in the frequency domain as the −3 dB frequency points along with some phase flatness across the bandwidth. The rise-time provides a measure for the maximum slope and maximum rate of change that the system can measure. Therefore, apart from noise, the output data must exhibit these limitations. These limitations, then, can become the basis for forming a fit to the data. In the case of an UWB (Ultra Wide Bandwidth) radar for which this technique was developed, there were 32 bins (R=32), and the rise-time was about 17 bins. A half cycle of the highest frequency term in the data was also about 17 bins—or 17 points in an interleaved record. Therefore, for this particular application, a quadratic fit on 17 points was chosen to both retain the system bandwidth and obtain SNR consistent with the total number of records integrated in the all the bins. This choice was based on trading compute time for a very small performance change afforded with larger p. Because all 32 bins are not used, there will remain a slight inequality in the SNR among output points because the total number of records in one batch of 17 bins will not be precisely equal to that of another group, as in:

$$\sum_{m=1}^{17} Q_{(m+a)_{mod32}} \neq \sum_{m=1}^{17} Q_{(m+b)_{mod32}}; \text{for } a \neq b \quad (9)$$

In order to guarantee identical numbers on integrated pulses, window width (p) would have to be made equal to the number of bins (R). But to do so can sometimes excessively complicate the processing steps because (1) a higher order model (e.g. cubic instead of quadratic) would be required (to maintain the bandwidth), (2) the coefficients (c's) in equation (7) become much more complicated to compute as the polynomial order increases, and (3) there are additional coefficients to compute. Therefore, the case where p<R will be used to illustrate the technique and to serve as an example of what is meant by a reasonable fit. It also demonstrates the generality of the technique and its ability to tradeoff speed, performance, and complexity.

The key to efficient computation is to recognize that the pattern of weights repeats every R points in the interleaved data. This feature can be seen by noting in equation (8) the modulo R arithmetic in the subscript of the W matrix since only R cases exist for R bins. The same modulo "wrapping" occurs when n<0 or n>R−1 when equation (5) is rewritten in terms of bins as:

$$\begin{bmatrix} 1 & -2 & 4 \\ 1 & -1 & 1 \\ 1 & 0 & 0 \\ 1 & 1 & 1 \\ 1 & 2 & 4 \end{bmatrix} \cdot \begin{bmatrix} \hat{B}_n(k) \\ a_1(k) \\ a_2(k) \end{bmatrix} = \begin{bmatrix} s(t_{i-2}) \\ s(t_{i-1}) \\ s(t_i) \\ s(t_{i+1}) \\ s(t_{i+2}) \end{bmatrix} = \begin{bmatrix} B_{n-2}(k) \\ B_{n-1}(k) \\ B_n(k) \\ B_{n+1}(k) \\ B_{n+2}(k) \end{bmatrix} \Rightarrow Ax = b \quad (10)$$

Here, $x_0$ has become $\hat{B}_n(k)$—the high SNR estimate that replaces the original data $B_n(k)$. The key impact of the weights repeating, is that equation (7), which is the solution to equations (5) and (10), can now be rewritten as, $$\hat{B}_n(k) = \sum_{j=-(p-1)/2}^{(p-1)/2} c_{n,j} B_{n+j}(k) \quad (11)$$

$$B_n(k) \equiv B_{R+n}(k-1) \text{ for } n<0$$

$$B_n(k) \equiv B_{R-n}(k+1) \text{ for } n>R-1$$

where:

n=0 . . . R/d−1; the index to a bin containing data with n$\xi$<TS-time$\leq$(n+1)$\xi$;

R is the number of bins used to partition the equivalent-time intervals;

d is the decimation factor;

$\xi$=τ/R; the time increment between bins.

k=0 . . . M−1; the index to the samples in each record produced by the A/D;

M is the number of A/D samples taken per trigger;

the $c_{n,j}$ are the first row of $(A^T W_n A)^{-1} A^T W_n$ where n indexes across the row; and $W_n$ is the p-by-p weight matrix defined in 8.

This formulation can be solved efficiently in hardware as will be described in the next section.

3. Hardware Implementation for Application of the Coefficients to the Data

To this point in the description, it has been shown that: (1) the problem of optimally combining the arbitrarily skewed input data into high SNR equivalent-time output data can be solved by using a plurality of curve fits, (2) that a polynomial fit covering a short segment of interleaved data is reasonable, and can be used to fit the data to accomplish the desired goals of maintaining signal bandwidth and imparting high SNR on all output points; (3) that the plurality of polynomial fits can be each be weighted to account for differing SNR on each input data point so as to optimally impart high SNR on the computed output data; and (4) that decimation can be handled to preclude calculation of points that will not be included in the output data. Next we discuss efficient implementation in hardware. We will show two hardware configurations or methods to implement this technique. Given the above teachings, the basic approach may be applied differently to other hardware configurations.

The first, and preferred implementation, is to directly apply equation (11) to the uninterleaved data, and interleave the result. A fast, vectorized method to compute equation (11) (generating a new set of high SNR bins) is to operate in three nested loops with n in the outer loop, k in the inner loop, and j in the middle loop. The middle and inner loops compute, for a single value of n, a $\hat{B}_n(k)$ by using a standard vectorized library call usually named a "scalar-vector multiply and accumulate." In this case, the accumulator is initialized to an M length vector of zeros. The "scalar-vector multiply" part performs the inner-loop by multiplying all M elements (k=0 to M−1) of the vector $B_n(k)$ by the scalar $c_{n,j}$. The "and accumulate" part performs the middle loop. Here, p accumulations are done (as j is incremented) to produce the output bin $\hat{B}_n(k)$. Speed-up logic can be implemented so that for any j where $c_{n,j}=0$, that term is simply skipped to eliminate M multiply-by-zero and M add-zero operations. The outer loop repeats this process for each of the (n=0 to R/d−1) desired output bins. The final output data is then derived by interleaving the resulting bins via the matrix transpose as shown in (3).

Because the accumulator function can be done within fast processor cache memory, the I/O- (input/output) rates are minimized—minimized to the point where every clock cycle can perform both a multiply and add. Because the data for each vector is contiguous—requiring no striding (taking, for example, every 8th memory position)—the "scalar-vector multiply and accumulate" call does, in fact, optimally achieve both an add and a multiply on every clock cycle on common DSP (digital signal processing) chips such as the Intel i860, Texas Instruments TMS320xxx series, Analog Devices AD210xx series, etc.

Although not coded this way, equation (12) illustrates the operation and the modulo-R special cases by stacking the terms for n<0 above the upper dotted line, and the terms for n>R−1 below the lower dotted line. Equation (3) illustrates storing data bins linearly in memory (end-to-end), treating that memory as a matrix and doing a matrix transpose operation, which provides interleaved data in linear memory address space. Comparing (3) and (12) ((3) is transposed with respect to (12)) along with (11) shows how the special cases allow a column in (12) to be a contiguous piece of the ET data. Therefore, (11) can be visualized as applying a length p window (of coefficients or weights) that starts at the top of the matrix, and multiplies each row by a different coefficient and sums the weighted rows together to form the first output row. Next, the window slides down d rows, the coefficients are changed, and the next output row is computed. This sequence is repeated until all R/d output rows are computed.

Equation (12) also illustrates end effects which must be considered. For a p point window, there are $$\frac{p-1}{2}$$

nonexistent data points at the beginning of a data record and another $$\frac{p-1}{2}$$

points at the end. These non-existent data points are shown in (12) as the points above the upper dotted line in the left column (where k=−1), and the points in the right most column below the lower dotted line (where k=M). Many techniques have been used to address FIR filter end effects and the same can be applied here. For example, the non-existent points are sometimes extrapolated by simply filling them with the average value of several data points leading up to the extrapolated section. Another technique is to simply use a different method to compute the first $$\frac{p-1}{2}$$

and last $$\frac{p-1}{2}$$

points of the output record, for example, with a shorter and shorter window. For some applications, the end points are simply truncated so that the output record length is p−1 points shorter. Any of these techniques or others may be used here.

$$\begin{bmatrix}
B_{R-\frac{p+1}{2}}(-1) & B_{R-\frac{p+1}{2}}(0) & \cdots & B_{R-\frac{p+1}{2}}(M-3) & B_{R-\frac{p+1}{2}}(M-2) \\
\vdots & \vdots & \cdots & \vdots & \vdots \\
B_{R-2}(-1) & B_{R-2}(0) & \cdots & B_{R-2}(M-3) & B_{R-2}(M-2) \\
B_{R-1}(-1) & B_{R-1}(0) & \cdots & B_{R-1}(M-3) & B_{R-1}(M-2) \\
\hdashline
B_0(0) & B_0(1) & \cdots & B_0(M-2) & B_0(M-1) \\
B_1(0) & B_1(1) & \cdots & B_1(M-2) & B_1(M-1) \\
\vdots & \vdots & \cdots & \vdots & \vdots \\
B_{R-2}(0) & B_{R-2}(1) & \cdots & B_{R-2}(M-2) & B_{R-1}(M-1) \\
B_{R-1}(0) & B_{R-1}(1) & \cdots & B_{R-2}(M-2) & B_{R-1}(M-1) \\
\hdashline
B_0(1) & B_0(2) & \cdots & B_0(M-1) & B_0(M) \\
B_1(1) & B_1(2) & \cdots & B_1(M-1) & B_1(M) \\
\vdots & \vdots & \cdots & \vdots & \vdots \\
B_{\frac{p-1}{2}}(1) & B_{\frac{p-1}{2}}(2) & \cdots & B_{\frac{p-1}{2}}(M-1) & B_{\frac{p-1}{2}}(M)
\end{bmatrix}$$

65

A second means of implementation is via a bank of FIR filters. This technique applies R/d FIR (finite impulse response) filters, each with p taps, to the "random SNR among points" data, such that together they compute a weighted least-squares (WLS) optimal, high SNR estimate for the output points. In this case, there is one FIR filter for each value of n (n=0, . . . , R/d−1) in equation (11). The $n^{th}$ FIR filter has p tap weights that are the coefficients $c_{d_n,j}$ with j=−(p−1)/2, . . . (p−1)/2. Relative to the above description of the direct application of equation (11) with three nested loops, each FIR filter performs the inner and middle loop, and the outer loop is comprised of the bank of FIR filters. As such, the FIR filters are adaptive filters where new coefficients are computed for each batch of input data. Each FIR filter is adaptive based on the random set of $Q_n$ obtained in a particular set of data.

Figure 6:
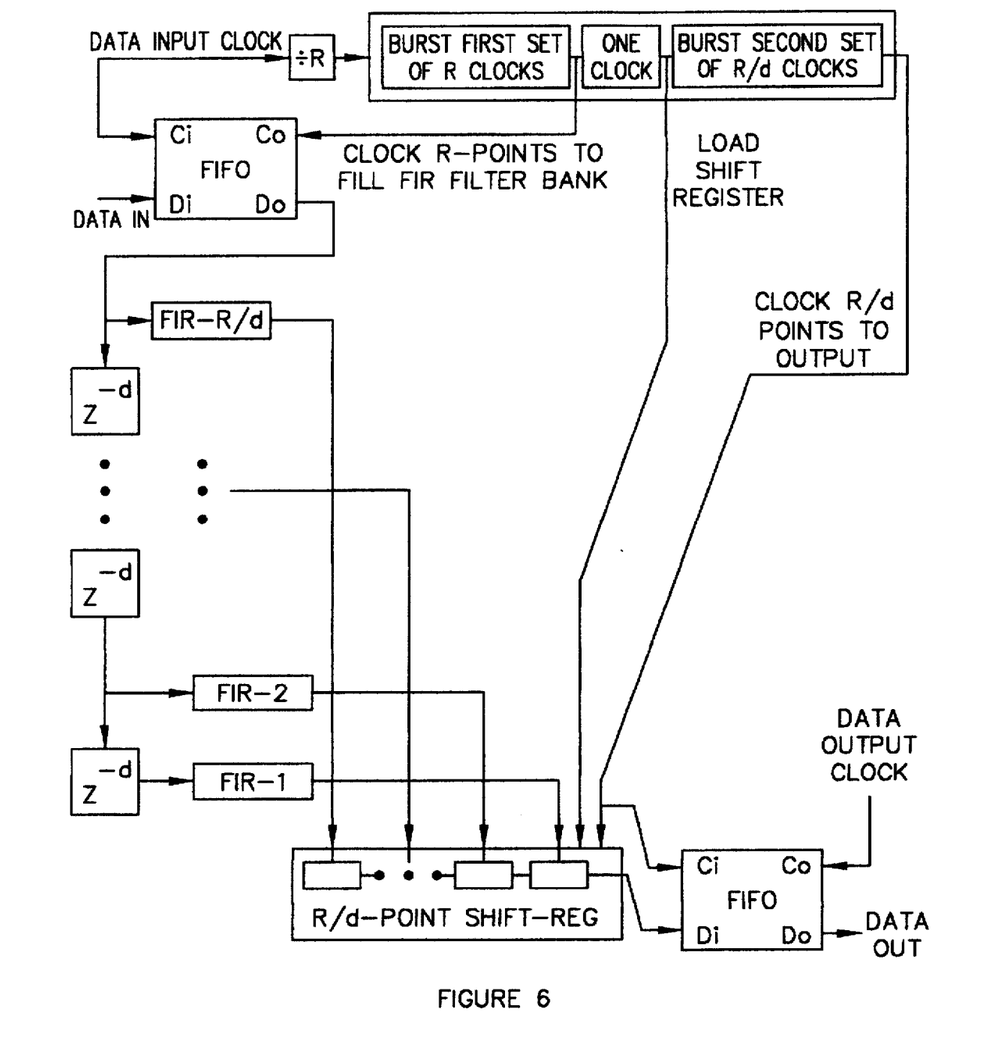
FIG 6 is a block diagram illustrating an implementation using FIR filters to apply the WLS coefficients to the data and thus compute the output data.

FIG. 6 is a block diagram illustrating the FIR implementation of applying the coefficients to the data. The input data has been sorted and averaged as described in equation (2), interleaved as described in equation (3), and is clocked into the FIFO (first in, first out) buffer memory. The FIR tap weights are programmed to be equal to the WLS coefficients computed based on the $Q_n$ of the input data set. The standard "$z^{-d}$" notation is used to mean a delay of line of d samples. The following process is repeated until the input data set has all been processed: (1) The input data is clocked, in groups of R samples, into the input FIFO; (2) a burst of R clocks pulls data out of the input FIFO and into the bank of FIR filters; (3) for each group of R samples, the bank of filters produce R/d output samples which are clocked into the output shift register; and (4) the R/d output samples are clocked out of the shift register into the output FIFO. Here, the shift register performs the function of interleaving of the output points. The input and output FIFO buffers are shown to aid illustrating the concept and can be used to relax timing constraints if needed.

4. Hardware Implementation to Compute the Coefficients

Key to implementing the above technique in real-time hardware is fast computation of the matrix inversion equations to get the coefficients $c_{n,j}$. Here we show that the matrix inversion and other operations indicated in (6) to compute the tap weights, are not necessary. Instead, a closed form vectorized function f to solve for the $c_{n,j}$ in (11) can be found such that $$c_{n,j}=f(Q) \quad (13)$$

Since the case with p=17 is too large to serve as an example, the case where p=9 will be used to illustrate that a vectorized function f(Q) can be obtained. This feature significantly impacts the speed of the algorithm since each batch of input records has its own set of random $Q_n$. Recomputing (6) via matrix operations would typically be prohibitive for real time applications. Appendix A lists a Mathematica program that symbolically sets up and solves equation (6) for the required coefficients.

The program produces closed form equations for the $c_{n,j}$ coefficients of (11). For the example case where p=9, j goes from −4 to 4 in (11), but the example implementation in the "C" programming language is coded such that j=0 to 8. For simplicity, the example below shows a fixed n that is associated with the Q(0) through Q(8) in the "C" code. The vector "t" is a set of temporary values that are computed once and then used in the computation of each component in the coefficient vector c.

| | | |
|---|---|---|
| t[1] = Q[0] * Q[1] | t[13] = Q[1] * Q[6] | t[25] = Q[3] * Q[7] |
| t[2] = Q[0] * Q[2] | t[14] = Q[1] * Q[7] | t[26] = Q[3] * Q[8] |
| t[3] = Q[0] * Q[3] | t[15] = Q[1] * Q[8] | t[27] = Q[4] * Q[5] |
| t[4] = Q[0] * Q[4] | t[16] = Q[2] * Q[3] | t[28] = Q[4] * Q[6] |
| t[5] = Q[0] * Q[5] | t[17] = Q[2] * Q[4] | t[29] = Q[4] * Q[7] |
| t[6] = Q[0] * Q[6] | t[18] = Q[2] * Q[5] | t[30] = Q[4] * Q[8] |
| t[7] = Q[0] * Q[7] | t[19] = Q[2] * Q[6] | t[31] = Q[5] * Q[6] |
| t[8] = Q[0] * Q[8] | t[20] = Q[2] * Q[7] | t[32] = Q[5] * Q[7] |
| t[9] = Q[1] * Q[9] | t[21] = Q[2] * Q[8] | t[33] = Q[5] * Q[8] |
| t[10] = Q[1] * Q[10] | t[22] = Q[3] * Q[4] | t[34] = Q[6] * Q[7] |
| t[11] = Q[1] * Q[11] | t[23] = Q[3] * Q[5] | t[35] = Q[6] * Q[8] |
| t[12] = Q[1] * Q[12] | t[24] = Q[3] * Q[6] | t[36] = Q[7] * Q[8] | d = 1/(4 * Q[2]* t[1] +
  Q[3]* [36 * t[1] + 36 * t[2] + 4 * t[9]] +
  Q[4]* [144 * t[1] + 256 * t[2] + 144 * t[3] + 36 *
  t[9] + 36 * t[10] + 4 * t[16]] +
  Q[5]* [400 * t[1] + 900 * t[2] + 900 * t[3] + 400 * t[4] +
  900 * t[6] + 4900 * t[7] + 14400 * t[8] + 144 * t[9] + 256 *
  t[10] + 144 * t[11] + 400 * t[13] + 2304 * t[14] + 7056 *
  t[15] + 36 * t[16] + 36 * t[17] + 144 * t[19] + 900 * t[20] +
  2916 * t[21] + 4 * t[22] + 36 * t[24] + 256 * t[25] + 900 *
  t[26] + 4 * t[28] + 36 * t[29] + 144 * t[30] + 4 * t[34] +
  36 * t[35] + 36 * t[36]] +
  Q[6]* [900 * t[1] + 2304 * t[2] +
  2916 * t[3] + 23304 * t[4] + 400 * t[9] + 900 * t[10] +
  900 * t[11] + 144 * t[16] + 256 * t[17] + 36 * t[22]] +
  Q[7] * [1764 * t[1] + 4900 * t[2] + 7056 * t[3] + 7056 *
  t[4] + 1764 * t[6] + 900 * t[9] + 2304 * t[10] + 2916 *
  t[11] + 900 * t[13] + 400 * t[16] + 900 * [17] + 400 * t[19] +
  144 * t[22] + 144 * t[24] + 36 * t[28]] +
  Q[8] * [3136 * t[1] + 9216 * t[2] + 14400 * t[3] + 16384 *
  t[4] + 9216 * t[6] + 3136 * t[7] + 1764 * t[9] + 4900 *
  t[10] + 7056 * t[11] + 4900 * t[13] + 1764 * t[14] + 900 *
  t[16] + 2304 * t[17] + 2304 * t[19] + 900 * t[20] + 400 *
  t[22] + 900 * t[24] + 400 * t[25] + 256 * t[28] +
  144 * t[29] + 4 * t[34]])

c[0] = 12 * Q[0] * d * [t[9] + 3 * t[10] − 20 * t[12] −
  75 * t[13] − 189 * t[14] − 392 * t[15] + t[16] − 15 *
  t[18] − 64 * t[19] − 175 * t[20] − 384 * t[21] − 5 *
  t[23] − 27 * t[24] − 84 * t[25] − 200 * t[26] − 5 *
  t[31] + 35 * t[32] + 120 * t[33] + 21 * t[34] + 128 *
  t[35] + 56 * t[36]]

c[1] = 4 * Q[1] * d * [−8 * t[2] − 18 * t[3] + 100 * t[5] +
  360 * t[6] + 882 * t[7] + 1792 * t[8] + t[16] − 18 *
  t[18] − 80 * t[19] − 225 * t[20] − 504 * t[20] − 504 *
  t[21] − 8 * t[23] − 45 * t[24] − 144 * t[25] − 350 * t[26] +
  10 * t[31] + 72 * t[32] + 252 * t[33] + 45 * t[34] +
  280 * t[35] + 126 * t[36]]

c[2] = 12 * Q[2] * d * [2 * t[1] − 6 * t[3] + 50 * t[5] +
  192 * t[6] + 4390 * t[7] + 1024 * t[8] − t[10] + 12 *
  t[12] + 50 * t[13] + 135 * t[14] + 294 * t[15] − t[23] −
  6 * t[24] − 20 * t[25] − 50 * t[26] + 2 * t[31] + 15 * t[32] +
  54 * t[33] + 10 * t[34] + 64 * t[35] + 30 * t[36]]

c[3] = 12 * Q[3] * d * [6 * t[1] + 8 * t[2] + 50 * t[5] + 216 * t[6] +
  588 * t[7] + 1280 * t[8] + t[9] + 16 * t[12] + 75 * t[13] + 216
  *
  t[14] + 490 * t[15] + 3 * t[18] + 16 * t[19] + 50 * t[20] +
  120 * t[21] + t[31] + 8 * t[32] + 30 * t[33] + 6 * t[34] + 40 *
  t[35] + 20 * t[36]]

c[4] = 4 * Q[4] * d * [36 * t[1] + 64 * t[2] + 36 * t[3] +100 * t[5] +
  576 * t[6] + 1764 * t[7] + 4096 * t[8] + 9 * t[9] + 9 * t[10] +
  36 * t[12] + 225 * t[13] + 729 * t[14] + 1764 * t[15] + t[16] +
  9 * t[18] + 64 * t[19] + 225 * t[20] + 576 * t[21] + t[23] + 9 *
  t[24] + 36 * t[25] + 100 * t6[26] + t[31] + 9 * t[32] + 36 *
  t[33] + 9 * t[34] + 64 * t[35] + 36 * t[36]]

c[5] = 12 * Q[5] * d * [20 * t[1] + 40 * t[2] + 30 * t[3] + 120 *
  t[6] + 490 * t[7] + 1280 * t[8] + 6 * t[9] + 8 * t[10] +
  50 * t[13] + 216 * t[14] + 588 * t[15] + t[16] + 16 * t[19] +
  75 * t[20] + 216 * t[21] + 3 * t[24] + 16 * t[25] + 50 *
  t[26] + t[34] +8 * t[35] + 6 * t[36]]

c[6] = 12 * Q[6] * d * [30 * t[1] + 64 * t[2] + 54 * t[3] − 50 * t[5] +
  294 * t[7] + 1024 * t[8] + 10 * t[9] + 15 * t[10] − 20 * t[12] +
  135 * t[14] + 490 * t[15] + 2 * t[16] − 6 * t[18] + 50 * t[20] +
  192 * t[21] − t[23] + 12 * t[25] + 50 * t[26] − t[32] − 6 *
  t[33] + 2 * t[36]]

c[7] = 4 * Q[7] * d * [126 * t[1] + 280 * t[2] + 252 * t[3] − 350 *
  t[5] − 504 * t[6] + 1792 * t[8] + 45 * t[9] + 72 * t[10] − 144 *
  t[12] − 225 * t[13] + 882 * t[15] + 10 * t[16] − 45 * t[18] −
  80 * t[19] + 360 * t[21] − 8 * t[23] − 18 * t[24] + 100 *

```
t[26] + t[31] - 18 * t[33] - 8 * t[35]]
c[8] = 12 * Q[8] * d * [56 * t[1] + 128 * t[2] + 120 * t[3] - 200 *
       t[5] - 384 * t[6] - 392 * t[7] + 21 * t[9] + 35 * t[10] - 84 *
       t[12] - 175 * t[13] - 189 * t[14] + 5 * t[16] - 27 * t[18] -
       64 * t[19] - 75 * t[20] - 5 * t[23] - 15 * t[24] - 20 *
       t[25] + t[31] + 3 * t[32] + t[34]]
```

Each one of the coefficients may be computed as a "vector gather" and a "vector dot product" library call. For example, c[0] is:

```
c[0] = 12 * Q[0] * d * [t[9] + 3 * t[10] - 20 * t[12] -
       75 * t[13] - 189 * t[14] - 392 * t[15] + t[16] - 15 *
       t[18] - 64 * t[19] - 175 * t[20] - 384 * t[21] - 5 *
       t[23] - 27 * t[24] - 84 * t[25] - 200 * t[26] - 5 *
       t[31] + 35 * t[32] + 120 * t[33] + 21 * t[34] + 128 *
       t[35] + 56 * t[36]]
```

It is computed efficiently in vectorized operations as follows:

Let $P_0$={9,10,12,13,14,15,16,18,19,20,21,23,24,25,26, 31,32,33,34,35,36}, a vector containing the indexes used on the vector "t."

Let $X_0$=Gather[P,t]={t[9],t[10],t[12] ... T[36]} so that $X_0$ is now a vector containing the elements of "t" who's indexes are contained in P.

Let $Y_0$=12*[1,3,-20,-75,-189,-392,1,-15,64,-175,-384,-5,-27,-84,-200,5,35,120,21,128,56], the coefficients that multiply the terms of "t."

With this formulation, the final computation can now be vectorized as, $$C[0] = (Q[0] * d * Dot[X_0, Y_0]) \quad (14)$$

where "Dot[$X_0$,$Y_0$]" is a vectorized library call that performs a dot product on $X_0$ and $Y_0$. Here, Y and P are not data dependent and therefore never change. They comprise the closed form solution of (6). Each of the R output bins requires recomputation of "t," and "d," and "X" and then each of the coefficients c[0] to c[p-1].

The computation of "t" is carried out in a sequence of scalar-vector multiplies, which can be seen by inspection. For example, the first is the scalar Q[0] times the vector Q[1] to Q[p].

The computation of "d" is vectorized similar to the c[j], as:

$$d = \frac{1}{[Q[2], Q[3], \ldots Q[8]] \bullet \Gamma} \quad (15)$$

where:

$\Gamma$=[$X_2 \cdot Z_2$, $X_3 \cdot Z_3$, ... $X_8 \cdot Z_8$]

$V_2$=[1]; a vector of indexes to the "t" for the Q[2] term $V_3$=[1, 2, 9]; a vector of indexes th the "t" for the Q[3] term $V_a$=[ ... ]; a vector of indexes to the "t" for the Q[a] term $X_2$=Gather[$V_2$,t]; or [t[1]]; the vector of t's of indexes $V_2$ $X_3$=Gather[$V_3$,t]; or [t[1], t[2], t[9]]; the vector of t's of index $V_3$ $X_a$=Gather[$V_a$,t]; or [ ... ]; the vector of t's of index $V_a$ $Z_2$=[4]; the coefficients for the "t" terms within the Q[2] term $Z_3$=[36,36,4]; the coefficients for the "t" terms within the Q[3] term $Z_a$=[ ... ]; the coefficients for the "t" terms within the Q[a] term.

Here, the Z's and V's never change. They are part of the closed form solution of (6). Therefore, the complete vectorized solution is obtained by pre-computing the vectors $Z_2$ to $Z_{p-1}$, $V_2$ to $V_{p-1}$, $Y_0$ to $Y_{p-1}$, and $P_0$ to $P_{p-1}$. The only real-time calculations are performing the vector-gather, vector-dot-product, and vector-scalar-multiply-and-accumulate library calls.

The file "lsfir9.out" generated by the Mathematica program listed in appendix A provides all of the required pre-calculated vectors. This file is direct vectorized "C" code where:

pindex contains all the $P_0$, $P_1$, $P_2$, ... $P_{p-1}$ indexes;

pcoef contains all the $X_0$, $X_1$, $X_2$, ... $X_{p-1}$ coefficients;

pterms is a vector containing the length of each of the P vectors;

poffset is the index into pindex, pointing to the P vectors within pindex; (e.g. $P_m$=pindex[poffset[m]], and $X_m$=pcoef[poffset[m]]);

ptotal is the length of pindex and pcoef;

vindex contains all the $V_0$, $V_1$, $V_2$, ... $V_{p-3}$ indexes;

vcoef contains all the $Z_0$, $Z_1$, $Z_2$, ... $Z_{p-3}$ indexes;

vterms is a vector containing the length of each of the V vectors;

voffset is the index into vindex, pointing to each of the V vectors within pindex (e.g. $V_m$=vindex[voffset[m]], and $Z_m$=vcoef[voffset[m]]); and vtotal is the length of vindex and vcoef.

Appendix B shows an example output from the Mathematica program without the T[] terms which were listed above.

Figure 7:
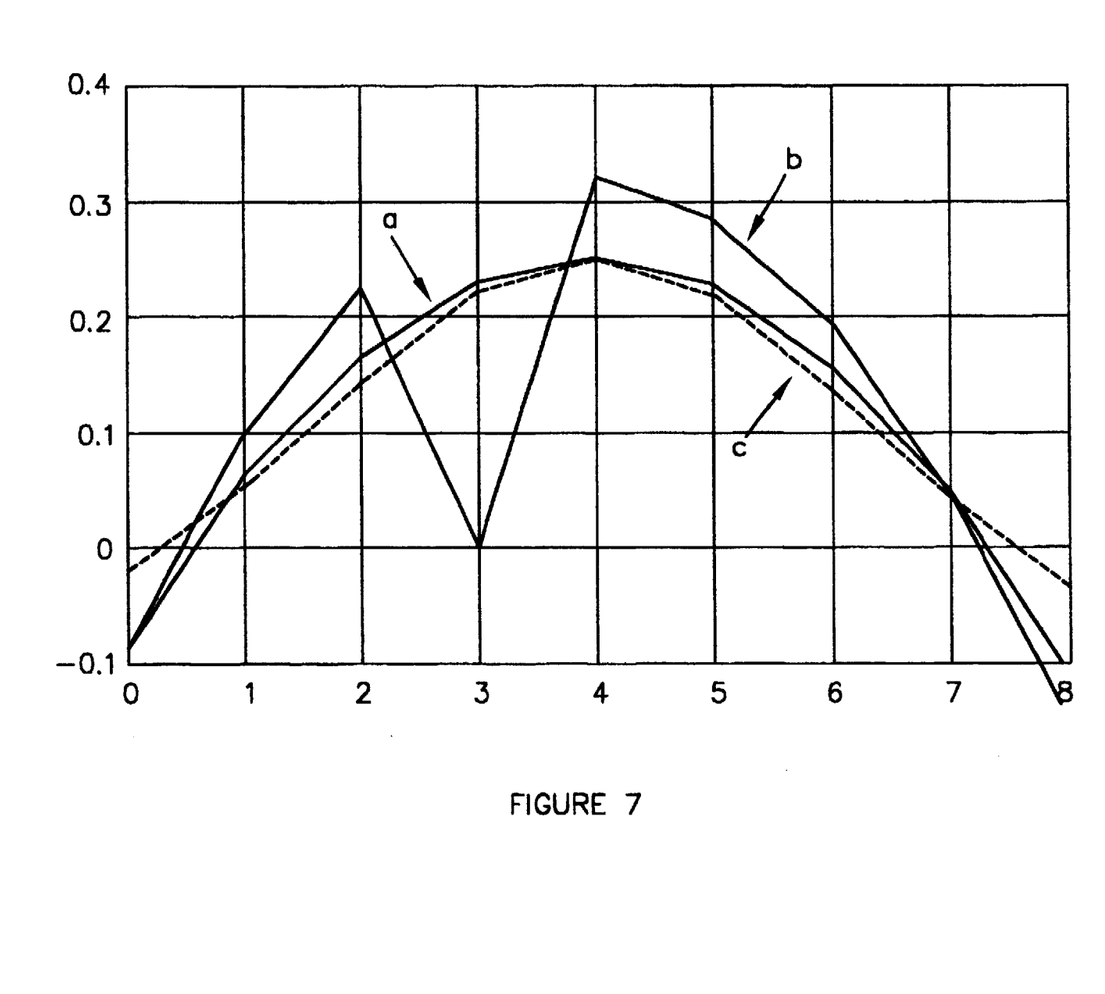
FIG. 7 illustrates the adapted weights of the present invention for test cases where $Q_n=1$ for all n., and for all $Q_n=1$ except $Q_3=0$, along with a sin(x)/x curve. The sin(x)/x function is a classic low-pass filter function and demonstrates the WLS filter provides a low-pass function for equally weighted data. The case where $Q_3=0$ also provides a low-pass function but ignores the bin that has no data.

FIG. 7 illustrates the coefficients generated using the present invention for test cases where $Q_n$=1 for all n., and for all $Q_n$=1 except $Q_3$=0, along with a sin(x)/x curve. The sin(x)/x function is a classic low-pass filter function and demonstrates that the WLS coefficients produce a low-pass function for equally weighted data. The case where $Q_3$=0 also provides a low-pass function but ignores the bin that has no data.

The above teachings demonstrate how to obtain a closed form weighted LS solution to an arbitrary order polynomial such that: (1) as the data weightings (the Q's in this case) are changed, recalculation of the required polynomial coefficients can be done with fast vectorized operations and no matrix inversions; and (2) no operations are wasted computing the complete weighted least squares polynomial fit, but only those operations needed to compute the required coefficients are performed. Consequently, these resulting operations may be computed in real-time on standard, inexpensive, processors, as well DSP and custom integrated chips. The above teachings also show how the resulting coefficients can be applied to the data with vectorized hardware such that the entire process is vectorized and can be pipelined for very fast, real-time computation on inexpensive, low-power hardware.

SUMMARY

To summarize, a means to obtain high SNR uniformly spaced ET (equivalent time) measurements from nonuniformly spaced data with unequal SNR among points by using vectorized hardware that is both fast and low cost has been shown. It has been shown that: (1) the problem can be posed as a plurality of curve fitting problems; (2) a reasonable equation exists that can be used to fit the data to accomplish the desired goals of maintaining signal bandwidth and imparting high SNR on all output points—a polynomial covering a short segment of interleaved data; (3) the fit can be computed directly, or equivalently via an FIR filter; (4) the coefficients (or FIR tap weights) can be computed using a weighted least squares procedure such that they adapt to random counts ($Q_n$) of input records falling into a particular time-slice; (6) that the entire weighted least squares solution is not required, (7) that the required coefficients needed from the weighted least squares solution can be found without matrix inversion, but instead, with simple and fast vectorized addition, multiplication and vector-gather operations; (8) that application of the coefficients to the data to produce the output data values can also be found with simple and fast vectorized addition, multiplication and vector-gather operations; and (9) that the entire algorithm structure can therefore be set up to compute very efficiently on low cost real-time hardware—that is, DSP (digital signal processing) integrated circuits, common micro-processors, or special purpose chip sets.

---

APPENDIX A
MATHEMATICA PROGRAM FOR VECTORIZABLE ANALYTIC SOLUTION TO WEIGHTED LEAST SQUARES OPTIMAL COEFFICIENTS

---

```
(*
This routine does a symbolic polynomial fit--deriving an
equation for a weighted least-squares WLS estimate for the
middle data point of a set of noisy data points.
ord = the order of the polynomial.
pnts = the number of data points in the set.
```

The output data is set up to feed into a vectorized "C" program where:
```
  int ptotal[1]=6;
  int pterms[3]={1,3,2}; is a vector containing the lengths of vectors
         within pindex and pcoef
  int poffset[3]={0,1,4}; is a running sum on pterms,
  int pindex[6]={2,6,9,10,15,22}; is a vector of indexes into a vector t[]
         of temporary values
  int pcoef[6]={13,3,253,18,91,7}; is a vector of containing the
         coefficients to the t[]
```
Using the above as an example, the tap weights (the c's below) applied to the data are:
```
  c[0]=(13*t[2]) * d * Q[0];
  c[1]=(3*t[6] + 253*t[9] + 18*t[10]) * d * Q[1];
  c[2]=(91*t[15] + 7*t[22]) * d * Q[2];
```

Each of these can be vectorized as:
```
  g=gather(pindex, t, ptotal);
    where y=gather(p,t,M) produces a vector "y" that are the values in
    vector "t" indexed by the values in vector p. "p" and "t" are pointers
    and "M" is the number of points to gather.

c[n] = dot(pcoef+poffset[n], g+poffset[n], pterms[n])
    where dot(x, y, M) does a dot product on "M" points using pointers
    x, and y into two vectors. Or:
  c[n] = dot(pcoef+poffset[n], gather(pindex+poffset[n], t, pterms[n]
(, pterms[n])
```

The WLS output point is then:
```
  y=c[0]*x[0] + c[1]*x[1] + c[2]*x[2]; or just dot (c, x, pnts) for a
  vectorized dot product.
    x[n] represents the data
    Q[n] represents the weight for the n-th data point
```

The equations for the vector t[] of temporary values is also in the output data. They have the form t[0]=Q[0]Q[1]; t[1]=Q[0]Q[2]; . . . t[]=Q[N−1]Q[N] which is the upper right triangle of (Transpose[Q]dot Q).

The "d" term is composed of similarly where:
```
  int vtotal[1]=4;
  int vterms[2]={3,1}; is a vector containing the lengths of vectors
         within vindex and vcoef
  int voffset[2]={0,3}; is a running total from vterms;
  int vindex[4]={1,8,19,2} is a vector of indexes into a vector t[] of
         temporary values
```

---

APPENDIX A
MATHEMATICA PROGRAM FOR VECTORIZABLE ANALYTIC SOLUTION TO WEIGHTED LEAST SQUARES OPTIMAL COEFFICIENTS
-continued

---

```
  int vcoef[4]={88,22,44,99} is a vector of containing the coefficients
  to the t[]
```

Using the above as an example, the "d" is computed as:
```
  dd[0]=(88*t[1] + 22*t[8] + 44*t[19]) * d * Q[2];
  dd[1]=(99*t[2]) * d * Q[3];
  d = 1/(dd[1]+dd[2]); or d=1/sum(dd);
```

Like the c's above, each of the dd[] terms can be vectorized as:
```
  dd[n]=dot(vcoef+voffset[n], gather(vindex+voffset[n], t, vterms[n]),
         vterms[n])
```

The output formatting for this Mathematica code was set up specifically to handle the order 2 case. Other order polynomials were not tested. The output coding will need modification to vectorize other order cases.

```
*)
ord = 2; (* order of polynomial *)
pnts = 9;(* number of points in the fit *)
p2 = (pnts−1)/2;
(* generate matrix with {1 x x^2 . . . x^ord}*)
X = Table[j^i,{j,−p2,p2}, {i,0,ord}];
X[[p2+1,1]] =;
(* Generate rule to change indexed variable to simple variable. *)
(* This change makes the inverse produce simpler results *)
r3 = Table[StringJoin["w[", ToString[i], "]->n", ToString[i−1]],
{i,1,pnts}];
ww = Array[w,pnts]/. ToExpression[r3];
W = DiagonalMatrix[ww];
(* Do the Pseudo Inverse for the Least Squares Fit *)
XtW = Transpose[X] . W;
Z0 = Inverse[XtW . X] . XtW;
       (* Since X was set up so that x=0 at the mid-point, *)
       (* the first coef. is the answer--so we pull it out *)
Z1=Z0[[1,Range[pnts]]];
(* Pull out the common denominator which turns out to be at the
mid-point *)
Dn = Factor[Denominator[Z1[[p2+1]]]];
(* Setup a rule to collect on middle weight *)
r5 = {StringJoin["n", ToString[p2+1]]};
r5 = Map[ToExpression,r5];
Dn = Collect[Dn,r5];
Z1 *= Dn;
(* this helps the optimizer *)
Z1=Factor[Z1];
Denominator[Z1];
invdn = 1/Dn;
(* make rule to assign equal weights to all points for testing *)
rl = Table[StringJoin["n", ToString[i−1], "->1"], {i,1,pnts}];
Za=(Z1[[Range[1,pnts]]]*invdn)/. Map[ToExpression,rl]
    1 2 13 18 59 18 13 2 1
{−(−),−−,−−,−−,−−,−−,−,−(−)}
    11 33 77 77 231 77 77 33 11
ListPlot[Za,PlotJoined->True,Frame->True,GridLines->Automatic,
    PlotLabel->"Tap Weights"]
-Graphics-
(* Make a substitution rule that orders the common terms into *)
(* a vector "t" so that the output can be vectorized in "C" *)
(*step 1 is to make a matrix where the common terms are the upper right
triangle *)
(*step 2 is to pull out the upper right triangle of the matrix *)
(* .and turn it into a substitution rule *)
(*step 3 is to collect terms using the substitution rule *)

(*first half of step 1--make matrix with a vector of weights *)
ra = Table[StringJoin["n", ToString[i−1]],{i,1,p2}];
rb = Table[StringJoin["n", ToString[i−1]],{i,p2+1,pnts}];
rc = Join[ra,rb];
rd = Join[{rc}];
(*second half of step 1--make matrix with common terms in upper right
triangle*)
RT = Transpose[rd] . rd;
(* rdd and RDD are used later simply for writing out the result using
Q's *)
rdd = Table[StringJoin["Q[", ToString[i],"]"], {i,0,pnts−1}];
```

APPENDIX A
MATHEMATICA PROGRAM FOR VECTORIZABLE ANALYTIC SOLUTION TO WEIGHTED LEAST SQUARES OPTIMAL COEFFICIENTS

```
rdd = Join[{rdd}];
RDD = Transpose[rdd] . rdd;
(* first half of step 2--setup rule to pull out common terms *)
r4 = {};
i = -1;
Do[
    Do[
        i = i+1;
        r4 = Join[r4,
            {StringJoin[ToString[RT[[j]][[k]]],"->t[", ToString[i],"]"]}];,
        {k,j+1,pnts}],
    {j,1,pnts-1}]
r4 = Map[ToExpression, r4];
(* Append Dn (the denominator) to Z1 so that collect *)
(* changes all equations to the same names all at once*)
(* The optimize package required this to identify all the common terms*)
Z1 = Join[Z1, {Dn}];
(* second half of step 2--collect terms and make substitution *)
k = Collect[Z1/.r4, ToExpression[rd[[1]]]];
(* Generate rule to change n0->Q[0] etc. so we can again use indexing
on Q's to help us*)
r6 = Table[StringJoin["n", ToString[i], "->Q[", ToString[i], "]"],
    {i,0,pnts-1}];
r6 = Map[ToExpression, r6];
(*apply rule to make substitution from n1, n2 etc. to Q[1], Q[2]etc.*)
k = k/.r6;
(* Save the answer so that it can be worked on in future Mathematica
sessions *)
Save[StringJoin["lsfir", ToString[pnts], ".k"], k];
k2 = Expand[k];
SetDirectory["e:\dma"];
file = OpenWrite[StringJoin["lsfir",ToString[pnts], ".out"]];
WriteString[file, "ord=", ToString[ord], ";\n"];
WriteString[file, "NumTerms=", ToString[pnts], ";n\"];
WriteString[file, "\\* Ztest=", CForm[Za], "*\\\n"];
WriteString[file, "Ztest[", ToString[pnts],"]=",N[Za,20], ";\n"];
len = Length[k2];
allpIndex = {};
allpCoef = {};
allpTerms = {{;

Do[(* Pull out coefficients and indexes for First len-1 elements *)
    element = k2[[j]];
    vars = Variables[element];
    vart = Cases[vars, t[__]];
    varQ = Cases[vars, Q[__]];
    newelement = Collect[element, varQ];
    tpoly = First[newelement/varQ];
    tcoef = Map[Coefficient[tpoly, #]&, vart];
    tindices = Map[First, vart];
    tlen = Length[tindices];
    allpIndex = Join[allpIndex, tindices];
    allpCoef = Join[allpCoef, tcoef];
    allpTerms = Append[allpTerms, tlen],
{j, 1, len-1}];
(* Change output vectors and their lengths to strings and write them out
in "C" *)
allpIndexString = ToString[allpIndex];
allpCoefString = ToString[allpCoef];
allpTermsString = ToString[allpTerms];
totalpTerms = Apply[Plus, allpTerms];
totalpTermsString = ToString[totalpTerms];
pTermLen = Length[allpTerms];
pTermLenString = ToString[pTermLen];
poffset={0};
Do[poffset=Append[poffset, poffset[[j]]+allpTerms[[j]]], {j, Length
[allpTerms]-1}];
poffsetString = ToString[poffset];
WriteString[file, "int ptotal[1]=", totalpTermsString, ";\n"];
WriteString[file,
    "int pterms[", pTermLenString,"]=", allpTermsString, ";\n"];
WriteString[file,
    "int poffset[", pTermLenString,"]=", poffsetString, ";\n"];
WriteString[file,
    "int pindex[", totalpTermsString,"]=", allpIndexString, ";\n"];
WriteString[file,
    "int pcoef[", totalpTermsString, "]=", allpCoefString, ";\n"];

(* Separate the Q[] Terms in the Last element of k2 so they can be
treated as above *)
element = k2[[len]];
vars = Variables[element];
vart = Cases[vars, t[__]];
varQ = Cases[vars, Q[__]];
newelement = Collect[element, varQ];
templist = Apply[List, newelement];
(* Sort by the index of the Q's so that the output vectors will be ordered
by the Q's *)
templistSorted =
    Sort[templist,
        Less[#1/.c_Q[qindex__]:>qindex, #2/.c_Q[qindex__]:>
        qindex]&];
(* Write comment listing Q's just for safety *)
WriteString[file, "\\* order of Q variables", ToString[varQ], "*\\",
"\n"];
len = Length[templistSorted];
(* Now Pull out coefficients and indexes for each Q[] term like we did
before *)
allvTerms={};
allvIndex={};
allvCoef={};
Do[
    element = templistSorted[[j]];
    vars = Variables[element];
    vart = Cases[vars, t[__]];
    varQ = Cases[vars, Q[__]];
    newelement = Collect[element, varQ];
    tpoly = First[newelement/varQ];
    tcoef = Map[Coefficient[tpoly, #]&, vart];
    tindices = Map[First, vart];
    tlen = Length[tindices];
    allvTerms = Append[allvTerms, tlen];
    allvIndex = Join[allvIndex, tindices];
    allvCoef = Join[allvCoef, tcoef],
{j, 1, len}];
voffset={0};
Do[voffset=Append[voffset, voffset[[j]]+allvTerms[[j]]],
    {j, Length[allvTerms]-1}];
(* Change output vectors and lengths to strings and write them out in
"C"*)
voffsetString = ToString[voffset];
allvIndexString = ToString[allvIndex];
allvTermsString = ToString[allvTerms];
allvCoefString = ToString[allvCoef];
totalvTerms = Apply[Plus, allvTerms];
totalvTermsString = ToString[totalvTerms];
vTermLenString = ToString[Length[allvTerms]];
WriteString[file, "int vtotal[1]=", totalvTermsString, ";\n"];
WriteString[file,
    "int vterms[", vTermLenString, "]=", allvTermsString, ";\n"];
WriteString[file,
    "int voffset[", vTermLenString, "]=", voffsetString, ";\n"];
WriteString[file,
    "int vindex[", totalvTermsString, "]=", allvIndexString, ";\n"]
WriteString[file,
    "int vcoef[", totalvTermsString, "]=", allvCoefString, ";\n"]
(* Write equations for t[] vector (e.g. t[0]=Q[0]*Q[1];) *)
i=-1;
Do[
    Do[
        i = i+1;
        WriteString[file, "t[", ToString[i], "]=", CForm[RDD[[j]][[k]]],
        ";\n"];,
        {k,j+1,pnts}],
    {j,1,pnts-1}]
Close[file]
ToExpression[StringJoin["!!lsfir", ToString[pnts], ".out"]];
```

APPENDIX B
EXAMPLE OUTPUT FROM
THE MATHEMATICA PROGRAM LISTING IN APPENDIX A ord=2;

NumTerms=9;

\* Ztest=List((-1)/11,2/33,13/77,18/77,59/231,18/77,13/77,2/33, (-1)/11)*\

Ztest[9]={-0.0909090909090909091, 0.0606060606060606061, 0.168831168831168831169, 0.233766233766233766234, 0.255411255411255411255, 0.233766233766233766234, 0.168831168831168831169, 0.0606060606060606061, -0.0909090909090909091};

int ptotal[1]=196;

int pterms[9]={21, 21, 21, 21, 28, 21, 21, 21, 21};

int poffset[9]={0, 21, 42, 63, 84, 112, 133, 154, 175};

int pindex[196]={8, 9, 11, 12, 13, 14, 15, 17, 18, 19, 20, 22, 23, 24, 25, 30, 31, 32, 33, 34, 35, 1, 2, 4, 5, 6, 7, 15, 17, 18, 19, 20, 22, 23, 24, 25, 30, 31, 32, 33, 34, 35, 0, 2, 4, 5, 6, 7, 9, 11, 12, 13, 14, 22, 23, 24, 25, 30, 31, 32, 33, 34, 35, 0, 1, 4, 5, 6, 7, 8, 11, 12, 13, 14, 17, 18, 19, 20, 30, 31, 32, 33, 34, 35, 0, 1, 2, 4, 5, 6, 7, 8, 9, 11, 12, 13, 14, 15, 17, 18, 19, 20, 22, 23, 24, 25, 30, 31, 32, 33, 34, 35, 0, 1, 2, 5, 6, 7, 8, 9, 12, 13, 14, 15, 18, 19, 20, 23, 24, 25, 33, 34, 35, 0, 1, 2, 4, 6, 7, 8, 9, 11, 13, 14, 15, 17, 19, 20, 22, 24, 25, 31, 32, 25, 0, 1, 2, 4, 5, 7, 8, 9, 11, 12, 14, 15, 17, 18, 20, 22, 23, 25, 30, 32, 34, 0, 1, 2, 4, 5, 6, 8, 9, 11, 12, 13, 15, 17, 18, 19, 22, 23, 24, 30, 31, 33};

int pcoef[196]={12, 36, -240, -900, -2268, -4704, 12, -180, -768, -2100, -4608, -60, -324, -1008, -2400, 60, 420, 1440, 252, 1536, 672, -32, -72, 400, 1440, 3528, 7168, 4, -72, -320, -900, -2016, -32, -180, -576, -1400, 40, 288, 1008, 180, 1120, 504, 24, -72, 600, 2304, 5880, 12288, -12, 144, 600, 1620, 3528, -12, -72, -240, -600, 24, 180, 648, 120, 768, 360, 72, 96, 600, 2592, 7056, 15360, 12, 192, 900, 2592, 5880, 36, 192, 600, 1440, 12, 96, 360, 72, 480, 240, 144, 256, 144, 400, 2304, 7056, 16384, 36, 36, 144, 900, 2916, 7056, 4, 36, 256, 900, 2304, 4, 36, 144, 400, 4, 36, 144, 36, 256, 144, 240, 480, 360, 1440, 5880, 15360, 72, 96, 600, 2592, 7056, 12, 192, 900, 2592, 36, 192, 600, 12, 96, 72, 360, 768, 648, -600, 3528, 12288, 120, 180, -240, 1620, 5880, 24, -72, 600, 2304, -12, 144, 600, -12, -72, 24, 504, 1120, 1008, -1400, -2016, 7168, 180, 288, -576, -900, 3528, 40, -180, -320, 1440, -32, -72, 400, 4, -72, -32, 672, 1536, 1440, -2400, -4608, -4704, 252, 420, -1008, -2100, -2268, 60, -324, -768, -900, -60, -180, -240, 12, 36, 12};

\* order of Q variables {Q[2], Q[3], Q[4], Q[5], Q[6], Q[7], Q[8]}*\ int vtotal[1]=84;

int vterms[7]={1, 3, 6, 28, 10, 15, 21};

int voffset[7]={0, 1, 4, 10, 38, 48, 63};

int vindex[84]={0, 0, 1, 8, 0, 1, 2, 8, 9, 15, 0, 1, 2, 3, 5, 6, 7, 8, 9, 10, 12, 13, 14, 15, 16, 18, 19, 20, 21, 23, 24, 25, 27, 28, 29, 33, 34, 35, 0, 1, 2, 3, 8, 9, 10, 15, 16, 21, 0, 1, 2, 3, 5, 8, 9, 10, 12, 15, 16, 18, 21, 23, 27, 0, 1, 2, 3, 5, 6, 8, 9, 10, 12, 13, 15, 16, 18, 19, 21, 23, 24, 27, 28, 33};

int vcoef[84]={4, 36, 36, 4, 144, 256, 144, 36, 36, 4, 400, 900, 900, 400, 900, 4900, 14400, 144, 256, 144, 400, 2304, 7056, 36, 36, 144, 900, 2916, 4, 36, 256, 900, 4, 36, 144, 4, 36, 36, 900, 2304, 2916, 2304, 400, 900, 900, 144, 256, 36, 1764, 4900, 7056, 7056, 1764, 900, 2304, 2916, 900, 400, 900, 400, 144, 144, 36, 3136, 9216, 14400, 16384, 9216, 3136, 1764, 4900, 7056, 4900, 1764, 900, 2304, 2304, 900, 400, 900, 400, 256, 144, 4};

---

What is claimed is:

1. An equivalent time processor, comprising:

A first input means for receiving a plurality of input data records wherein each input data record has a plurality of equally spaced data points representing a signal plus noise which has been sampled with a sample spacing of $\tau$, and wherein the plurality of input data records are time-skewed with respect to each other in an arbitrary fashion, relative to said signal;

A second input means for receiving a set of skew-time, $T_r$, measurements of the time between a trigger synchronous with said signal and the sample-time of the first data point in each of said plurality of input data records;

A sorting means that directs said input data records in one of R ways according to whether their skew-time falls within R contiguous ranges, wherein R can be chosen arbitrarily;

A plurality of R accumulators which accumulate all records directed to them by said sorting means, A plurality of R counting means which provide a plurality of counts $Q_n$, of the number of records accumulated in each of said plurality of R accumulators, wherein n indexes the plurality of accumulators and is typically n=0,1,2, ... R-1, to produce the plurality of counts, $Q_n$;

A division means to compute the plurality of numbers $q_n=1/Q_n$ for all said plurality of counts $Q_n$ provided by said plurality of R counting means;

A plurality of scalar-vector-multiplier means which multiply the accumulated results in each of said plurality of R accumulators, by its associated said $q_n$ provided by said division means, to produce a plurality of R averaged records;

A processing means that uses said set of skew-time measurements, said plurality of counts $Q_n$, and said plurality of R averaged records to generate an output data record having a plurality of equally spaced data points representing said signal plus lower noise, which has been sampled with a sample spacing of m$\tau$/n where m and n are any positive integer, wherein said processing means combines said plurality of arbitrarily skewed input data records such that said plurality of samples in said output record have a least-squares optimal SNR (signal to noise ratio), and wherein said processing means optimally preserves frequency components beyond the Nyquist limit of said input data records by combining said plurality of arbitrarily skewed input data records such that said plurality of samples in said output record contain frequency components beyond the Nyquist limit of said input data records;

An output means for providing said output record as high SNR, high bandwidth, uniformly spaced, equivalent time measurements.

2. The process of claim 1 wherein said processing means comprises:

A coefficient generation algorithm that uses said plurality of counts $Q_n$, to compute a plurality of coefficient vectors, wherein each vector is a set of coefficients that is optimal in a the weighted least squares sense, for fitting a curve through p points in said plurality of averaged records, surrounding in time, an output point, and wherein the weights used for the weighted least squares computation are provided by said counts $Q_n$; so that the coefficients generated account for the arbitrary, and sometime zero, SNR of said averaged data records;

A plurality of coefficient applicator means which accepts said plurality of coefficient vectors and said plurality of R averaged records and produces a plurality of smoothed, high SNR data records;

An interleaver that interleaves the plurality of said smoothed, high SNR data records to produces a uniformly spaced, high SNR interleaved data record.

3. The process of claim 2 wherein said plurality of coefficient applicator means is implemented with fast vector-scalar-multiply hardware which is easily pipelined to carryout multiple operations simultaneously.

4. The process of claim 1 wherein said processing means comprises:

A coefficient generation algorithm that uses said plurality of counts $Q_n$, to compute a plurality of coefficient vectors, wherein each vector is a set of coefficients that is optimal in a the weighted least squares sense, for fitting a curve through p points in said plurality of averaged records, surrounding in time, an output point, and wherein the weights used for the weighted least squares computation are provided by said counts $Q_n$; so that the coefficients generated account for the arbitrary, and sometime zero, SNR of said averaged data records;

An interleaver the interleaves said plurality of averaged data records to produces an interleaved data record with non uniform SNR;

A plurality of adaptive finite impulse response (FIR) filters, each having a plurality of taps, wherein the tap weights are provided by said coefficient vectors generated by said coefficient generation algorithm;

A distribution network which feeds said interleaved data record to the plurality of FIR filters;

An interleaver that accepts the output of the plurality of FIR filters, decimates the output of each FIR filter as needed, and combines them outputs of said FIR filters and generate said output data record.

5. The process of claim 2 or 4, wherein said coefficient generation algorithm is implemented without any matrix inversions, but as a closed form solution—with weighting from said counts $Q_n$ as parameters—such that it is implemented with simple and fast vector addition and vector multiplication, and vector gather operations that are optimal for digital signal processing (DSP) hardware and digital logic.

6. The process of claim 4 wherein said FIR filters have decimated outputs to minimized the operations required to implement said FIR filters.

* * * * *